United States Patent
Terzioglu et al.

(10) Patent No.: US 7,889,553 B2
(45) Date of Patent: Feb. 15, 2011

(54) SINGLE-POLY NON-VOLATILE MEMORY CELL

(75) Inventors: Esin Terzioglu, Aliso Viejo, CA (US); Gil I. Winograd, Aliso Viejo, CA (US); Morteza Cyrus Afghahi, Cota De Caza, CA (US)

(73) Assignee: Novelics, LLC., Laguna HIlls, CA (US)

( * ) Notice: Subject to any disclaimer, the term of this patent is extended or adjusted under 35 U.S.C. 154(b) by 363 days.

(21) Appl. No.: 12/109,331

(22) Filed: Apr. 24, 2008

(65) Prior Publication Data

US 2008/0291728 A1 Nov. 27, 2008

Related U.S. Application Data

(60) Provisional application No. 60/913,540, filed on Apr. 24, 2007.

(51) Int. Cl.
*G11C 16/04* (2006.01)
*H01L 29/788* (2006.01)

(52) U.S. Cl. .............................. 365/185.1; 365/185.05; 365/185.29; 365/185.18; 257/315

(58) Field of Classification Search ............ 365/185.18, 365/185.29, 185.05, 185.1; 257/315
See application file for complete search history.

(56) References Cited

U.S. PATENT DOCUMENTS

| | | | | |
|---|---|---|---|---|
| 4,423,371 | A  * | 12/1983 | Senturia et al. | 324/663 |
| 5,761,121 | A  * | 6/1998 | Chang | 365/185.14 |
| 6,191,980 | B1 * | 2/2001 | Kelley et al. | 365/185.29 |
| 6,459,615 | B1 * | 10/2002 | McPartland et al. | 365/185.1 |
| 2002/0195648 | A1 * | 12/2002 | Hirata | 257/315 |
| 2003/0137005 | A1 * | 7/2003 | Mitros et al. | 257/315 |
| 2004/0113198 | A1 * | 6/2004 | Mitros | 257/316 |

* cited by examiner

*Primary Examiner*—J. H. Hur
(74) *Attorney, Agent, or Firm*—Haynes & Boone, LLP.

(57) ABSTRACT

A non-volatile memory cell includes: a substrate including diffusion regions for a read-out transistor; a capacitor formed in a poly-silicon layer adjacent the substrate, the capacitor including a floating gate for the read-out transistor and a control gate, the floating gate and the control gate each having finger extensions, the finger extensions from the floating gate interdigitating with the finger extensions from the control gate; and
a programming line coupled to the control gate.

6 Claims, 3 Drawing Sheets

SINGLE-POLY NON-VOLATILE MEMORY CELL

RELATED APPLICATION

This application claims the benefit of U.S. Provisional Application No. 60/913,540, filed Apr. 24, 2007, the contents of which are hereby incorporated by reference.

TECHNICAL FIELD

This application relates generally to non-volatile memory, and more particularly to a single-poly non-volatile memory.

BACKGROUND

Non-volatile memory cells include a floating gate in which electric charge may be injected. As implied by the name, the floating gate electrically "floats" with regard to other structures in the cell such that the injected charge is retained even if the memory cell is powered down. In a classic non-volatile memory cells, two separate polysilicon layers are required. A first polysilicon layer forms the floating gate. A second overlaying polysilicon layer forms a control gate that is used to program the floating gate. Because CMOS semiconductor manufacturing processes provide only a single polysilicon layer, "single-poly" non-volatile memory cells have been developed in which the control gate is formed as a buried diffusion region.

Although conventional single-poly non-volatile memory cells are compatible with CMOS manufacturing processes, the buried diffusion area occupies die area and thus decreases device density, thereby increasing manufacturing costs. Moreover, the buried diffusion region is prone to junction breakdown. To increase density, single-poly non-volatile memory cells have been developed in which the control gate is implemented as a trench metal-insulator-metal (MIM) capacitor. However, forming a trench MIM capacitor demands extra processing steps and thus also increases costs.

To advance the state of the art for single-poly non-volatile memory circuits, commonly-assigned U.S. patent application Ser. No. 11/536,524 discloses a control gate implemented through a metal-layer capacitor formed in the semiconductor process metal layers. In an NMOS embodiment, an anode of the metal-layer capacitor couples to the floating gate. The cathode couples to a positive programming voltage and couples to the anode through fringe capacitance. However, a metal-layer capacitor approach may become problematic as CMOS semiconductor processes advance into the deep sub-micron regime because of the low-k dielectric used in such processes to insulate the metal layers. In less dense semiconductor processes, a higher-k dielectric is used to insulate the upper metal layers that inhibits leakage between the anode and cathode. However, a low-k dielectric is relatively leaky such that a manufacturer cannot guarantee that the floating gate will retain its programming charge over a period of several years for metal-layer-capacitor non-volatile memory cells.

Accordingly, there is a need in the art for improved non-volatile memory cells.

SUMMARY

This section summarizes some features of the invention. Other features are described in the subsequent sections.

In accordance with an embodiment of the invention, a non-volatile memory cell is provided that includes: a substrate including diffusion regions for a read-out transistor; a capacitor formed in a polysilicon layer adjacent the substrate, the capacitor including a floating gate for the read-out transistor and a control gate, the floating gate and the control gate capacitively coupling through interdigitated finger extensions; and a programming line coupled to the control gate.

In accordance with another aspect of the invention, a method of programming a non-volatile memory cell is provided. The non-volatile memory cell includes a fringe capacitor formed in a single polysilicon layer, wherein the fringe capacitor forms a floating gate and a control gate that capacitively couple through interdigitated fingers, and wherein the control gate couples to a programming line and the floating gate couples to an erase line through a tunneling device. The method comprises: charging the programming line to a programming voltage; and while the programming line is charged, lowering a potential of the erase line such that electrons tunnel from the erase line into the floating gate so as to program the non-volatile memory cell.

In accordance with another aspect of the invention, a method of erasing a programmed non-volatile memory cell is provided. The non-volatile memory cell includes a fringe capacitor formed in a single polysilicon layer, wherein the fringe capacitor forms a floating gate and a control gate that capacitively couple through interdigitated fingers, and wherein the control gate couples to a programming line and the floating gate couples to an erase line through a tunneling device. The method comprises: charging the erase line to a programming voltage; and while the erase line is charged, lowering a potential of the programming line such that electrons tunnel from the floating gate through the tunneling device.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

Figure 1:
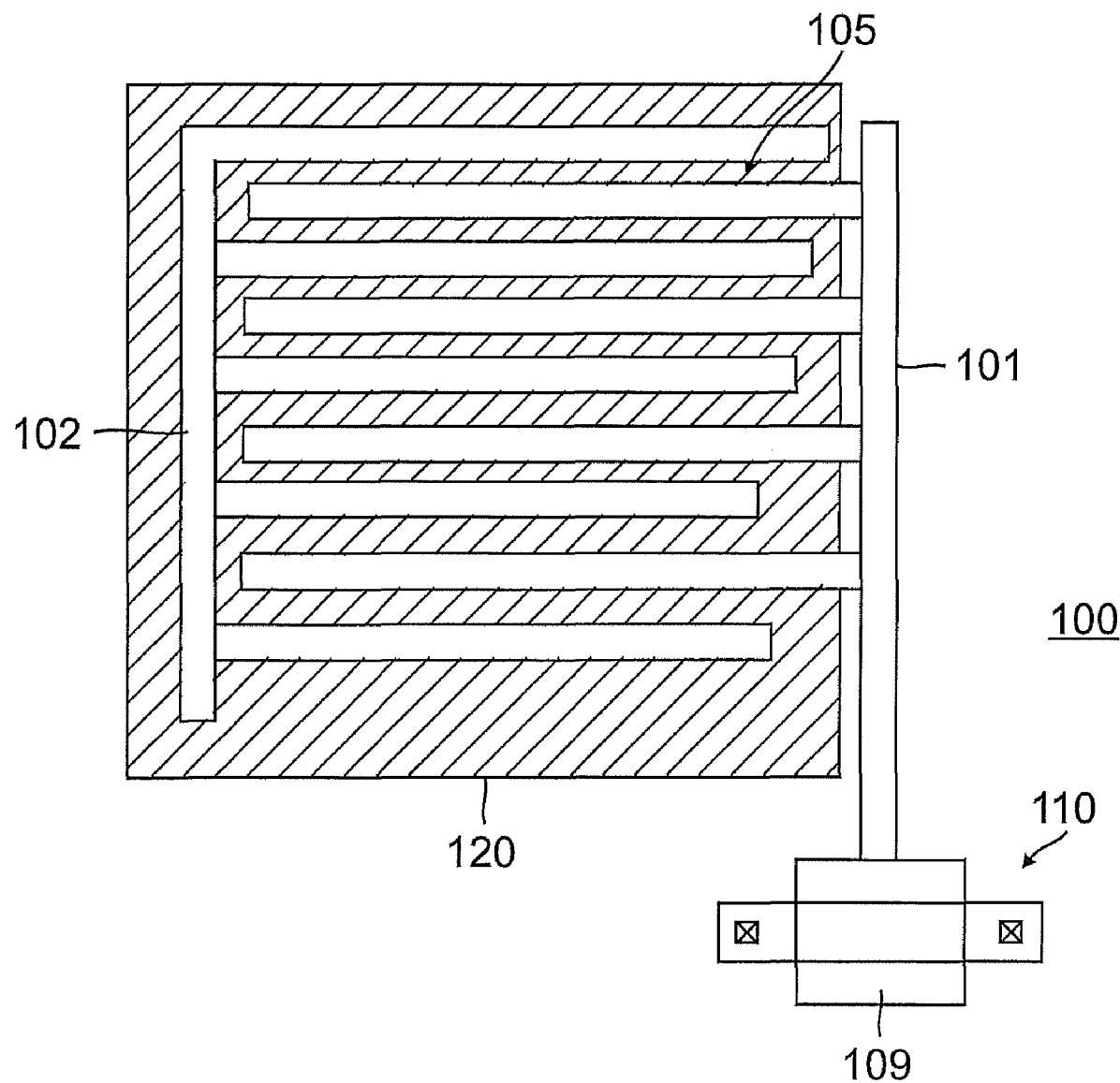
FIG. 1 is a plan view of a single-poly non-volatile memory cell in which a polysilicon capacitor functions as the floating gate and the control gate in accordance with an embodiment of the invention.

Turning now to the drawings, FIG. 1 illustrates a schematic view of a non-volatile memory cell 100 in which a floating gate 101 and a control gate 102 are formed using a polysilicon fringe capacitor 105. Fringe capacitor 105 is formed in a single poly-silicon layer used to form transistor gates in semiconductor processes such as CMOS. The fringe capacitance exists between interdigitated finger extensions of floating gate 101 and control gate 102. Another extension of floating gate 101 forms a gate 109 for a readout transistor 110. A programming line (not illustrated) couples to control gate 102 so that the voltage of floating gate 102 may be shifted as desired. The programming line may also couple to a plate 120 formed in an adjacent metal layer 1 (M1) to increase the capacitive coupling to the floating gate. Plate 120 would thus overlap the area occupied by poly-silicon fringe capacitor 105. In modern high-density semiconductor processes, an insulating layer that separates M1 from the poly layer has a relatively high dielectric constant (high k) value. However, the dielectric that separates additional metal layers from M1 (such as that between M1 and adjacent metal layer 2 (M2), the layer between M2 and adjacent metal layer 3 (M3), and so on) is low k such that a metal capacitor approach as discussed previously is untenable in modern high-density semiconductor processes. Advantageously, the polysilicon fringe capacitor architecture shown in FIG. 1 is compatible with single-poly semiconductor processes such as CMOS yet does not suffer from long-term loss of data through leaky dielectric layers.

Figure 2:
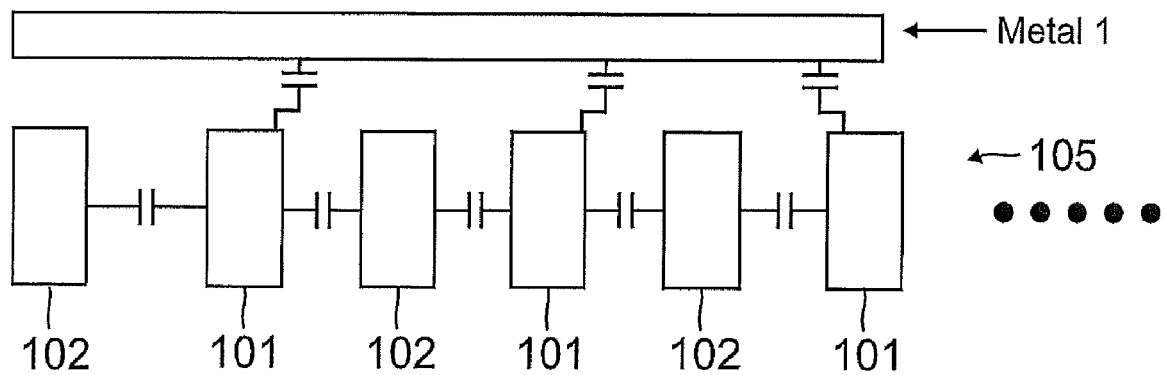
FIG. 2 is an illustration of the fringe capacitances in the polysilicon capacitor of FIG. 1.

A conceptual illustration of the fringe capacitances that couple to floating gate 101 is shown in a cross-sectional view of fringe capacitor 105 in FIG. 2. The interdigitated fingers of floating gate 101 and control gate 102 form numerous fringe capacitance junctions. Similarly, plate 120 also forms fringe capacitance junctions with floating gate 101 finger extensions. In this fashion, the voltage of floating gate 101 is tightly coupled to that for control gate 102 such that if the control gate is raised to a programming voltage of, for example, 10V, the floating gate will also be raised to substantially the programming voltage.

Figure 3:
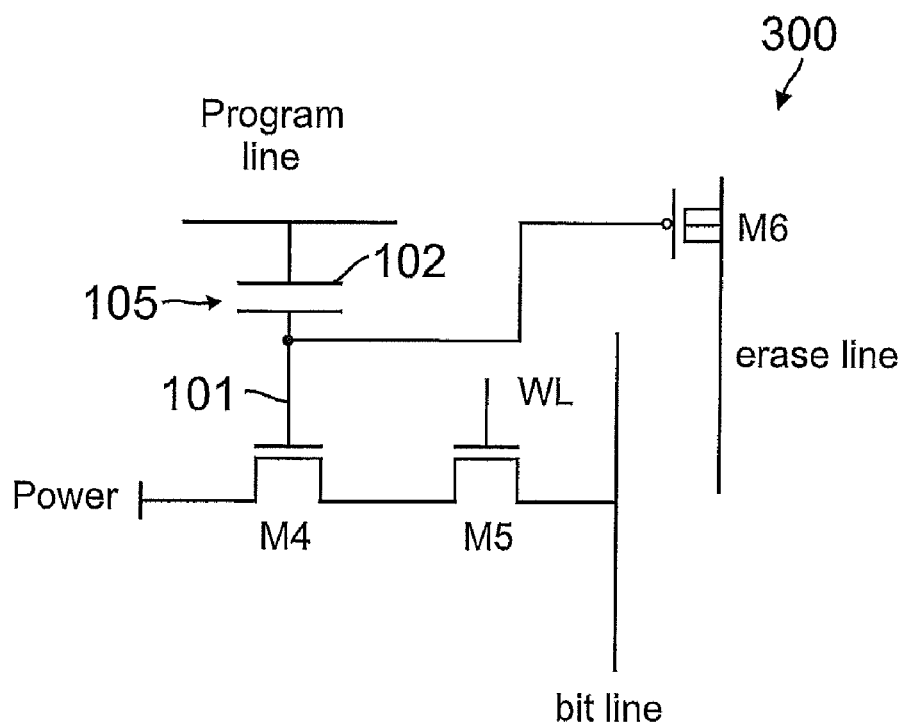
FIG. 3 is a schematic illustration of a single-poly non-volatile memory cell in which a polysilicon capacitor functions as the floating gate and the control gate in accordance with an embodiment of the invention.
Figure 4:
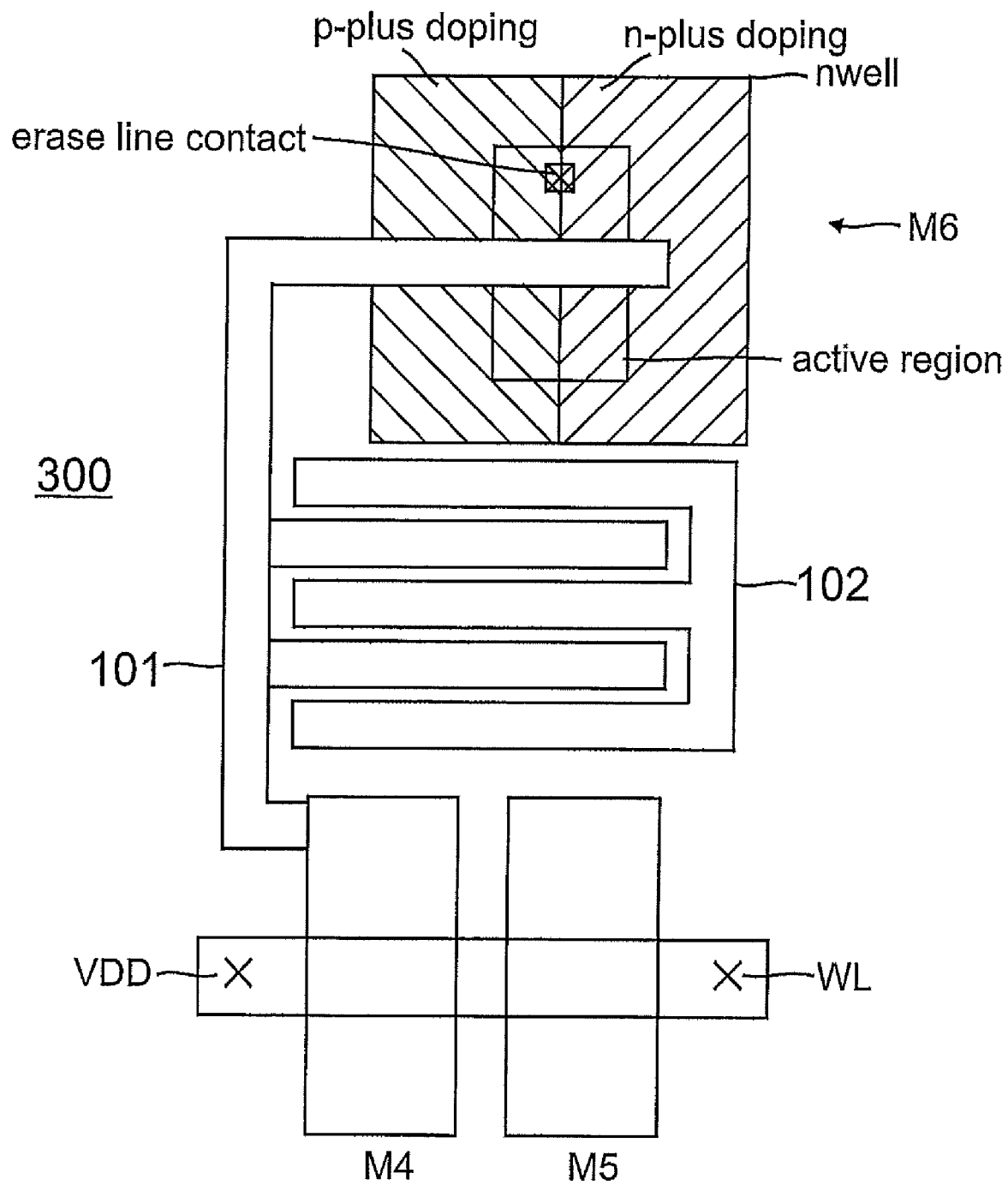
FIG. 4 is a lay-out view of a single-poly non-volatile memory cell in which a poly-silicon capacitor functions as the floating gate and the control gate in accordance with an embodiment of the invention.

Turning now to FIGS. 3 and 4, an example non-volatile single-poly memory cell 300 is illustrated. Fringe capacitor 105 has its control gate 102 couple to a program line as discussed earlier. Floating gate 101 controls a readout transistor M4 (denoted as transistor 110 in FIG. 1) that couples between a power supply and an access transistor M5. The gate of access transistor M5 is controlled by a word line (WL) such that if the word line is asserted, a bit line couples through M5 to the source of M4 (assuming an NMOS embodiment). It will be appreciated, however, that an equivalent PMOS embodiment may be constructed. To prevent tunneling damage to the oxide layer separating floating gate 101 and the channel for M4, floating gate 101 includes an extension that couples to a tunneling device M6. In an NMOS embodiment, tunneling device M6 is formed in an n-well adjacent to the interdigitated fingers of fringe capacitor 105.

Tunneling device is formed in a similar fashion as that used to create other active devices such as M4 and M5. In that regard, a thin oxide (not illustrated) separates the extension of floating gate 101 from the active region formed in the n-well for tunneling device M6. Surrounding the active region would be much thicker oxide such as, for example, a shallow trench isolation (STI) oxide. Thus, although the entire n-well is designated as being either n+ or p+ doped, these dopants will not affect the n-well outside the active region. In general, foundry rules require the doping to overlap the active region by a certain margin and for that reason the doping of the n-well is shown to spread across its entirety. However, it will be appreciated the overlap of the doping with regard to the tunneling device's active region will depend upon a given foundry's design rules. The n+ and p+ doping of the n-well will also dope the corresponding portions of the floating gate correspondingly. As known in the arts (for an NMOS embodiment), the remainder of floating gate 101 and control gate 102 would be doped n+. Because floating gate 101 is polysilicon, there would be no p-n junction activity at the boundary of the p+ doped n-well and floating gate with the remainder of the n+ doped floating gate—instead, floating gate 101 simply acts as a metal. An erase line contact couples to both the n+ doped and the p+ doped portions of the tunneling device's active region outside of the channel region that underlies the extension of floating gate 101 over the active region. Referring back to FIG. 3, the potential on the erase line can thus be used in conjunction with potentials on the program line and with optionally with regard to read-out transistor M4 so as to either program or erase the floating gate.

To program cell 300, both the erase line and optionally the source/drain (shown coupled to the power supply node in FIG. 3 for illustration purposes) of read-out transistor M4 are grounded while the programming line is brought to a suitable programming voltage such as 10V. In general, the power supply node for read-out transistor M4 may be left unaffected if one does not desire tunneling through the gate oxide of read-out transistor M4—an option that will prevent tunneling damage to this gate oxide. It will be appreciated that these voltages may be varied depending upon a particular semiconductor application. For example, the erase line and/or the source/drain may be brought to a negative voltage to assist programming. Because of the capacitive coupling between the control gate and the floating gate, the floating gate will also be charged to approximately the programming voltage as a result of the preceding voltage changes. As a result, the n-type tunneling capacitor that exists in the n+ doped channel portion of the tunneling device (the channel portion underneath the n+ doped portion of the floating gate extension overlapping the active region) will undergo, for example, Fowler-Nordheim tunneling of electrons from the n+ doped channel into the floating gate. It will be appreciated that the programming voltages may be altered such that other programming mechanisms such as hot electrons could be used to program the floating gate.

Erasure of the floating gate is a complementary operation as discussed with regard to programming. The erase line is brought to a suitable programming voltage (such as, for example, 10V) while the source/drain is charged by a power supply voltage (in general, the power supply voltage is much lower than the programming voltage such that no tunneling would then occur through the gate oxide of read-out transistor M4). The programming line is brought to a suitable low voltage such as ground or perhaps a negative voltage. It will be appreciated that the n-type tunneling capacitor discussed previously will have its channel region inverted by such a voltage combination: the floating gate will have an excess of electrons whereas the channel will have an excess of holes. But note that outside the n+ doped channel region active region is just n-well. For the floating gate to be erased, holes must be supplied to the channel to replace those that are destroyed through recombination with electrons from the floating gate. But there would be no way for the holes to be replenished through an electrical contact to the erase line through just the surrounding n-well. Thus, the p+ doped portion of the active region functions to electrically couple the erase line to the channel. In this fashion, holes can readily be supplied from the erase line through the p+ doped active region so that the floating gate may be erased.

It is desirable to minimize the coupling between the erase line and the floating gate. This coupling reduction may be accomplished through, for example, making the tunneling device M6 small with respect to the fringe capacitance between the program line/control gate and the floating gate.

Referring again to FIG. 3, a plurality of memory cells 300 may be arrayed in a row (not illustrated) with respect to a given word line. To erase a row of such memory cells, the floating gate is coupled low while the corresponding erase lines are raised to a programming voltage. If all the row's erase lines are so activated, then all the cells on the row will be erased. However, if only a portion of the cells in the row are to be erased, then the erase lines for the cells that are not to be erased should be kept at a low or an intermediate voltage during the erase operation. In this fashion, a selective erase operation may be performed. Cells in other rows should have their program lines kept at an intermediate voltage during this erase operation such that the cells in these other rows will not be erased regardless of the state of their erase lines because the voltage difference across the tunneling device M6 will be limited.

Similarly, a row of memory cells may be programmed by charging the corresponding program lines to the programming voltage while the erase lines are brought to a suitable potential such as ground, slightly above ground, or a negative potential. If all the erase lines for the row are so lowered, then all memory cells in the row will be programmed. However, if some of the erase lines are kept at an intermediate voltage, the corresponding memory cells will not be programmed. To prevent tunneling through the gate of the read-out transistor M4, the power supply node shown in FIG. 3 may be powered to an intermediate or a power supply voltage. Alternatively, if this "power supply node" is grounded, then additional tunneling may occur through the gate of the read-out transistor.

To read a row of cells, the row's word line is raised sufficiently to turn on access transistor M5 such that it has a sufficiently low resistance across its channel. In this fashion, each memory cell may be sensed by detecting the resistance between the power supply node to read-out transistor M4 and the corresponding bit line. It will be appreciated that a source-follower arrangement is thus created such that the bit line voltage will eventually settle to a voltage related to the amount of charge stored on the memory cell's floating gate. An erased cell will have a high voltage on the floating gate and therefore a low resistance across the read-out transistor. Conversely, a programmed cell will have a low voltage on its floating gate and thus a high resistance across its read-out transistor. In this fashion, the memory cell's binary contents may be sensed or read.

The above-described embodiments of the present invention are merely meant to be illustrative and not limiting. It will thus be obvious to those skilled in the art that various changes and modifications may be made without departing from this invention in its broader aspects. Therefore, the appended claims encompass all such changes and modifications as fall within the true spirit and scope of this invention.

We claim:

1. A non-volatile memory cell, comprising:
   a substrate including diffusion regions for a read-out transistor;
   a capacitor formed in a polysilicon layer adjacent the substrate, the capacitor including a floating gate for the read-out transistor and a control gate, the floating gate and the control gate each having finger extensions, the finger extensions from the floating gate interdigitating with the finger extensions from the control gate; and
   a programming line coupled to the control gate, wherein the substrate is p– doped such that the read-out transistor is an NMOS transistor, the substrate including an n-well adjacent the interdigitation of the finger extensions, the n-well having an active region with a first portion doped n+ and a second portion doped p+, the floating gate including an additional extension that overlays both portions in the active region so as to create an n+ doped channel and a p+ doped channel in the active region.

2. The non-volatile memory cell of claim 1, wherein a first semiconductor process metal layer is adjacent the polysilicon layer, the non-volatile memory cell further comprising a plate formed in the first semiconductor process metal layer, the plate overlapping the interdigitation of the finger extensions and coupled to the programming line.

3. The non-volatile memory cell of claim 1, further comprising an erase line coupled to both the first portion and the second portion of the active region outside the active region channels.

4. The non-volatile memory cell of claim 3, further comprising:
   an access transistor;
   a word line; and
   a bit line, the access transistor being controlled by the word line such that the read-out transistor is coupled to the bit line if the access transistor is switched on by the word line.

5. The non-volatile memory cell of claim 1, wherein the floating gate and the control gate each have at least four interdigitated finger extensions.

6. A method of programming a non-volatile memory cell, wherein the non-volatile memory cell includes a fringe capacitor formed in a single polysilicon layer, the fringe capacitor forming a floating gate and a control gate that capacitively couple through interdigitated fingers, the control gate coupling to a programming line and the floating gate coupling to an erase line through a tunneling device, the method comprising:
   charging the programming line to a programming voltage; and
   while the programming line is charged, lowering a potential of the erase line such that electrons tunnel from the erase line into the floating gate so as to program the non-volatile memory cell, wherein the floating gate forms a gate for a read-out transistor, the method further comprising: lowering a potential of a terminal for the read-out transistor while the programming line is charged such that electrons tunnel through the gate of the read-out transistor into the floating gate.

* * * * *